(12) United States Patent
Furukawa

(10) Patent No.: US 6,804,279 B2
(45) Date of Patent: Oct. 12, 2004

(54) SURFACE EMITTING LASER APPARATUS, ITS FABRICATION METHOD, AND ITS DRIVING METHOD

(75) Inventor: Yukio Furukawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/035,427

(22) Filed: Jan. 4, 2002

(65) Prior Publication Data

US 2002/0094004 A1 Jul. 18, 2002

(30) Foreign Application Priority Data

Jan. 17, 2001 (JP) ........................................ 2001-008878

(51) Int. Cl.[7] .............................................. H01S 5/00
(52) U.S. Cl. ........................... 372/43; 372/43; 372/44; 372/45; 372/46; 372/47; 372/48; 372/49; 372/50; 372/99
(58) Field of Search .............................. 372/43–50, 99

(56) References Cited

U.S. PATENT DOCUMENTS

| | | | | |
|---|---|---|---|---|
| 5,283,447 A | * | 2/1994 | Olbright et al. | 257/85 |
| 5,596,595 A | * | 1/1997 | Tan et al. | 372/96 |
| 5,903,588 A | * | 5/1999 | Guenter et al. | 372/46 |
| 6,064,683 A | * | 5/2000 | Johnson | 372/46 |
| 6,088,378 A | | 7/2000 | Furukawa | 372/92 |
| 6,222,868 B1 | | 4/2001 | Ouchi et al. | 372/50 |
| 6,282,226 B1 | | 8/2001 | Furukawa | 372/94 |
| 6,320,893 B1 | * | 11/2001 | Ueki | 372/96 |

OTHER PUBLICATIONS

G.M. Yang et al., Ultralow threshold current vertical–cavity surface–emitting lasers obtained with selective oxidation, Electronic Letters, May 25th 1995, vol. 31, No. 11, pp. 886–888.

K.D. Choquette et al., "Cavity characteristics of selectively oxidized vertical–cavity lasers", Appl. Phys. Lett 66(25), Jun. 19, 1995, 1995 American Institute of Physics, pp. 3413–3415.

* cited by examiner

*Primary Examiner*—Don Wong
*Assistant Examiner*—Delma R. Flores-Ruiz
(74) *Attorney, Agent, or Firm*—Fitzpatrick, Cella, Harper & Scinto

(57) ABSTRACT

In a surface emitting laser apparatus having at least a light-emitting device, there is provided a cavity structure of the light-emitting device including a first n-type semiconductor multi-layer mirror, a first active layer, a p-type spacer layer, a second active layer, and a second n-type semiconductor multi-layer mirror formed on a substrate. Current confinement structures are formed in the vicinity of the first and second active layers, respectively. A p-side electrode is electrically connected to the p-type spacer layer. A first n-side electrode is electrically connected to the first n-type semiconductor multi-layer mirror, and a second n-side electrode is electrically connected to the second n-type semiconductor multi-layer mirror.

11 Claims, 7 Drawing Sheets

SURFACE EMITTING LASER APPARATUS, ITS FABRICATION METHOD, AND ITS DRIVING METHOD

BACKGROUND OF THE INVENTION

1. Field of the Invention

The present invention relates to a surface emitting laser apparatus usable as a light source in the fields of large-capacity optical communication, optical interconnection, optical information processing, parallel optical recording, and the like, its fabrication method, and its driving method.

2. Description of the Related Background Art

The arrangement of arrayed laser devices for parallel transmission of optical information has been recently studied to achieve large-capacity optical communication and optical interconnection. Also, a structure utilizing plural recording light sources has been studied to further advance the printing speed of laser beam printers. Particular interest has been shown in the use of vertical cavity surface emitting lasers (VCSELs) as light emitting devices suitable for the array arrangement of those light sources.

Recently, the following surface emitting laser has been energetically researched and developed to improve the performance of the laser. In such a surface emitting laser, a semiconductor layer containing aluminum (Al) is provided near the active layer, and this Al-containing layer is selectively oxidized to form a current confinement structure. An example of such a laser is disclosed in "Appl. Phys. Lett. 1995, 66, (25), pp.3413–3415". FIG. 1 is a schematic diagram of this structure, which includes an n-type semiconductor multi-layer mirror 1001, an active layer 1003, a semiconductor layer 1005 containing Al, a p-type semiconductor multi-layer mirror 1007, and a p-side electrode with an opening.

In the above structure of FIG. 1, the Al-containing semiconductor layer 1005 is selectively oxidized, and its peripheral portion is altered so as to form an insulating layer 1006 that is chiefly formed of $Al_xO_y$ to form the current confinement structure. Due to the current confinement structure, current can be effectively and efficiently injected into the active layer 1003, and hence, low threshold current and single-mode oscillation can be achieved in this type of surface emitting laser.

The resistance of that laser is, however, high since the resistance of the p-type semiconductor multi-layer mirror 1007 is large and the current passing region in the current confinement structure is small in area (about several micrometers×several micrometers, or twenty (20) square micrometers). As a result, the laser inevitably has disadvantages that its operation voltage needed to obtain a desired light power increases and that its characteristics are lowered due to a great amount of heat generated in the device.

Several methods have been researched and developed to reduce the resistance of the device. One of those methods is a method of injecting a current through a path escaping the semiconductor multi-layer mirror, which is disclosed in "Electron. Lett., 1995, 31, (11), pp.886–888". FIG. 2 is a schematic diagram of this structure, which includes an n-type substrate 2001, ann-type semiconductor multi-layer mirror 2003, an active layer 2005, a semiconductor layer 2007 containing Al, a p-type contact layer 2009, and an undoped semiconductor multi-layer mirror 2011. In this example, the Al-containing semiconductor layer 2007 is selectively oxidized, and its peripheral portion is altered so as to form an insulating layer 2008 chiefly formed of $Al_xO_y$ to form the current confinement structure. Further, a p-side electrode 2013 is deposited on the p-type contact layer 2009, and an n-side electrode 2015 is deposited on the bottom surface of the n-type substrate 2013. The p-side electrode 2013 is formed on the contact layer 2009 in this structure. The p-type semiconductor multi-layer mirror 2011 having a high resistance is not present in a current path between the n-side electrode 2015 and the p-side electrode 2013.

In another method for reducing the resistance of the device, a p-type semiconductor multi-layer mirror, a semiconductor layer containing Al, an active layer, and an n-type semiconductor multi-layer mirror are layered on a p-type substrate, etching is conducted from the side of the n-type semiconductor multi-layer mirror to expose the side of the Al-containing semiconductor layer and form a protruded pole, and the Al-containing semiconductor layer is oxidized toward its central portion to construct the current confinement structure. In this structure, the resistance can be reduced since the area of a current flow through the p-type semiconductor multi-layer mirror can be enlarged.

In the above-mentioned conventional surface emitting lasers, however, an increase in the resistance due to a small area of the current flow through the current confinement structure is not considered, though the resistance can be decreased by escaping the p-type semiconductor multi-layer mirror as a current path.

SUMMARY OF THE INVENTION

It is an object of the present invention to provide a surface emitting laser apparatus in which its operation voltage and consumption electric power can be reduced due to its low resistance, a common-anode construction is possible, a high-speed modulation can be achieved, and a construction capable of wavelength division multiplexing can be readily attained, its fabrication method, and its driving method.

The present invention is generally directed to a surface emitting laser apparatus having at least a light-emitting device, which includes a substrate, a cavity structure of the light-emitting device including a first n-type semiconductor multi-layer mirror, a first active layer, a p-type spacer layer, a second active layer, and a second n-type semiconductor multi-layer mirror formed on the substrate. First and second current confinement structures are formed in the vicinity of the first and second active layers, respectively, a p-side electrode is electrically connected to the p-type spacer layer, a first n-side electrode is electrically connected to the first n-type semiconductor multi-layer mirror, and a second n-side electrode is electrically connected to the second n-type semiconductor multi-layer mirror.

In the above structure, since no p-type semiconductor multi-layer mirror is needed, the resistance of the laser apparatus can be reduced. Accordingly, the operation voltage and consumption power can be reduced. Further, where a plurality of light-emitting devices are arranged in the laser apparatus, a structure of the common-anode type can be constructed by putting the p-side electrodes of the respective devices on an equipotential level.

Where first and second current confinement portions are formed in the vicinity of the first and second active layers, respectively, resistors of the current confinement portions having a high resistance are connected in a parallel form. Therefore, the resistance of the laser apparatus can be further decreased.

The current confinement structure near the active layer can be established by forming an ion-injected region in a peripheral portion of the device. This structure can preferably be formed as follows. A first p-type current confinement layer including a first Al-containing semiconductor layer is formed between the first active layer and the p-type spacer layer, a second p-type current confinement layer including a second Al-containing semiconductor layer is formed between the second active layer and the p-type spacer layer, and the first and second Al-containing semiconductor layers are selectively oxidized, respectively. The current structure can be flexibly established with good controllability by this method.

Specifically, the substrate can be an n-type semiconductor substrate, and the first n-type semiconductor multi-layer mirror can be electrically connected to the first n-side electrode through the substrate. In such a structure, where a plurality of light-emitting devices are arranged, the first n-side electrodes and the p-side electrodes of the devices can be readily connected electrically, respectively.

The substrate can also be a semi-insulating-type semiconductor substrate. In this case, the first n-type semiconductor multi-layer mirror can include a contact layer whose portion is exposed, the n-side electrode can be formed on the exposed portion, and the first n-type semiconductor multi-layer mirror can be electrically connected to the first n-side electrode through the contact layer. In such a structure, where a plurality of light-emitting devices are arranged, the first n-side electrodes of the devices can be readily connected electrically.

It is preferable to determine layer number, material, composition and thickness of the spacer layer such that the first and second active layers are positioned at loops of electric-field standing waves present in the cavity structure, respectively.

Further, it is preferable to determine layer number, material, composition and thickness of the first and second p-type current confinement layers such that the first and second Al-containing semiconductor layers are positioned at nodes of electric-field standing waves present in the cavity structure, respectively.

The spacer layer can preferably be formed of alternately-layered semiconductor layers of a high doping concentration and semiconductor layers of a low doping concentration. In this case, layer numbers, materials, compositions and thicknesses of the semiconductor layers of high and low doping concentrations are preferably determined such that the semiconductor layers of a high doping concentration are positioned at nodes of electric-field standing waves present in the cavity structure, respectively.

A third n-type current confinement layer including a third Al-containing semiconductor layer can be interposed between the first n-type semiconductor multi-layer mirror and the first active layer, and/or between the second n-type semiconductor multi-layer mirror and the second active layer. In this structure, another current confinement structure consisting of the third Al-containing selectively oxidized semiconductor layer is formed in the third p-type current confinement layer.

The present invention is also directed to a method of fabricating the above surface emitting laser apparatus having at least a light-emitting device, in which the first n-type semiconductor multi-layer mirror, the first active layer, the first p-type current confinement layer including the first Al-containing semiconductor layer, the p-type spacer layer, the second p-type current confinement layer including the second Al-containing semiconductor layer, the second active layer, and the second n-type semiconductor multi-layer mirror are formed on the substrate; the semiconductor layers are etched until a side of the first p-type current confinement layer is exposed to form a pole-shaped light-radiation region; the first and second Al-containing semiconductor layers are oxidized toward a central portion of the light-radiation region to form the current confinement structures above and below the spacer layer; a peripheral portion of the light-radiation region is removed until a surface of the spacer layer is exposed to form a step structure; and the p-side electrode is formed on the exposed surface of the spacer layer.

The present invention is further directed to a method of fabricating the above surface emitting laser apparatus having at least a light-emitting device and using a semi-insulating-type semiconductor substrate, in which the first n-type semiconductor multi-layer mirror including the contact layer, the first active layer, the first p-type current confinement layer including the first Al-containing semiconductor layer, the p-type spacer layer, the second p-type current confinement layer including the second Al-containing semiconductor layer, the second active layer, and the second n-type semiconductor multi-layer mirror are formed on the semi-insulating-type substrate; the semiconductor layer are etched until a surface of the contact layer is exposed to form a pole-shaped light-radiation region; the first and second Al-containing semiconductor layers are oxidized toward a central portion of the light-radiation region to form the current confinement structures above and below the p-type spacer layer; a peripheral portion of the light-radiation region is removed until a surface of the p-type spacer layer is exposed to form a step structure; the p-side electrode is formed on the exposed surface of the p-type spacer layer; and the first n-side electrode is formed on the exposed surface of the contact layer.

The present invention is also directed to a method of driving the above surface emitting laser apparatus having at least a light-emitting device, in which the first and second n-side electrodes are electrically connected to put the first and second n-side electrodes at an equipotential level; and one of current injection and voltage application is performed between the first and second n-side electrodes and the p-side electrode to drive the surface emitting laser apparatus.

The present invention is further directed to a method of driving the above surface emitting laser apparatus having at least a light-emitting device, in which one of current injection and voltage application is performed between the first n-side electrode and the p-side electrode; and one of current injection and voltage application is performed between the second n-side electrode and the p-side electrode independently of the first step to drive the surface emitting laser apparatus.

The present invention is further directed to a method of driving the above surface emitting laser apparatus having at least a light-emitting device, in which one of bias-current injection and bias-voltage application is performed between the first n-side electrode and the p-side electrode; and one of modulated-current injection and modulated-voltage application is performed between the second n-side electrode and the p-side electrode independently of the first step to modulate an oscillation condition of the surface emitting laser apparatus.

The present invention is also directed to a method of driving the above surface emitting laser apparatus of a common-anode type having a plurality light-emitting devices, in which the first n-side electrodes of the light-emitting devices are electrically connected to put the first n-side electrodes on an equipotential level; one of common bias-current injection and common bias-voltage application is performed between the first n-side electrodes and the p-side electrodes for the light-emitting devices; and one of modulated-current injection and modulated-voltage application is performed between the second n-side electrode and the p-side electrode for each light-emitting device to modulate oscillation conditions of the respective surface emitting devices independently.

The present invention is further directed to a method of driving the above surface emitting laser apparatus which has a plurality light-emitting devices, has the first n-type semiconductor multi-layer mirror including the partly-exposed contact layer, the first n-side electrode is formed on the exposed portion, and the first n-type semiconductor multi-layer mirror is electrically connected to the first n-side electrode through the contact layer. In this driving method, the p-side electrodes of the light-emitting devices are electrically connected to put the p-side electrodes on an equipotential level; and a ratio between a current injected between the first n-side electrode and the p-side electrode and a current injected between the second n-side electrode and the p-side electrode, or a ratio between a voltage applied between the first n-side electrode and the p-side electrode and a voltage applied between the second n-side electrode and the p-side electrode is changed for each light-emitting device to drive the respective light-emitting devices independently.

These advantages, as well as others will be more readily understood in connection with the following detailed description of the preferred embodiments and examples of the invention in connection with the drawings.

DESCRIPTION OF THE PREFERRED EMBODIMENTS

Figure 1:
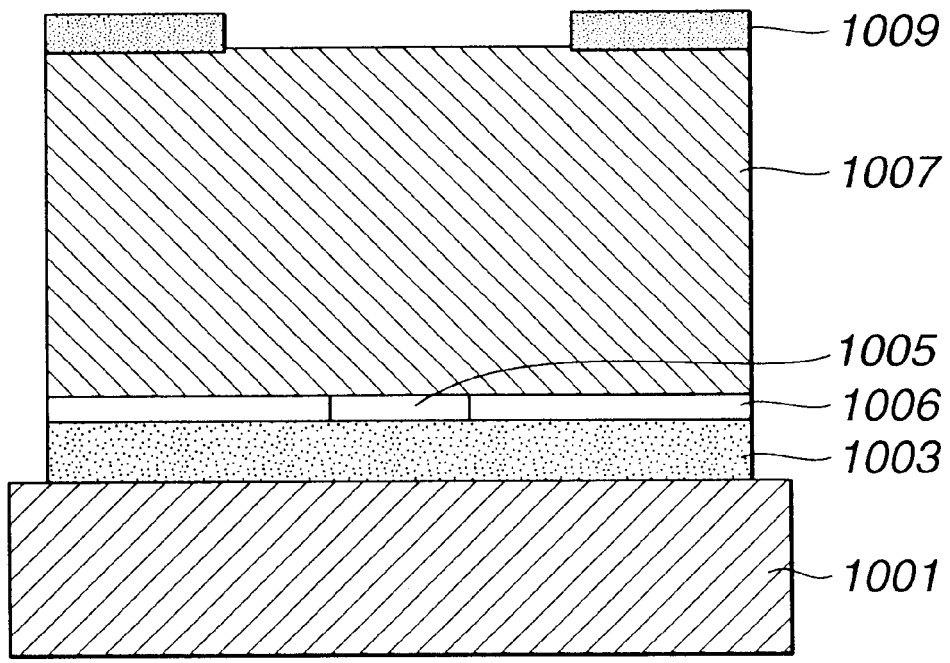
FIG. 1 is a cross-sectional view illustrating a first conventional surface emitting laser.
Figure 2:
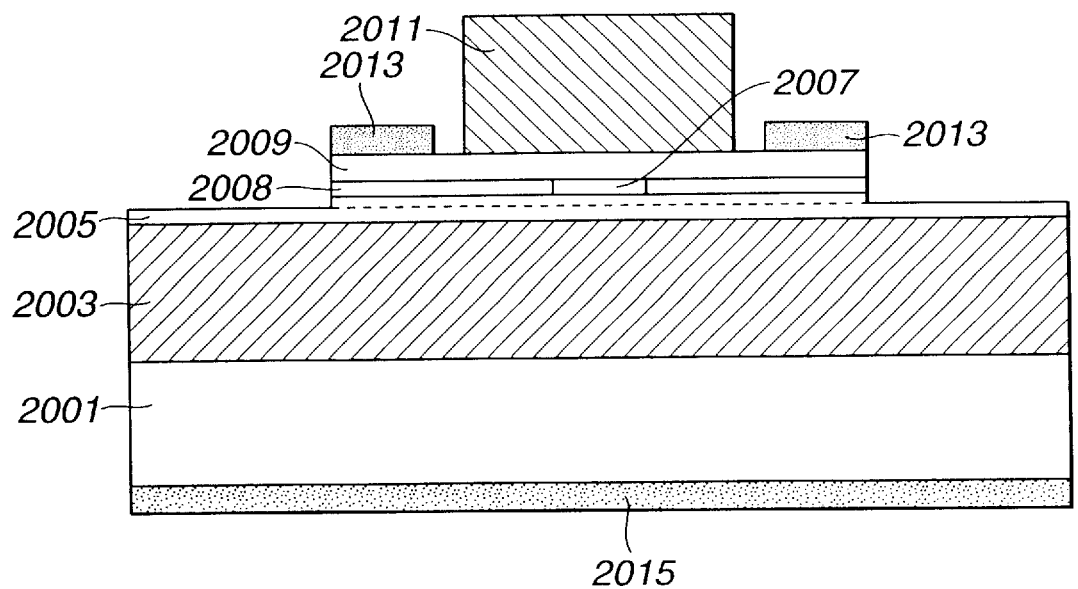
FIG. 2 is a cross-sectional view illustrating a second conventional surface emitting laser.
Figure 3:
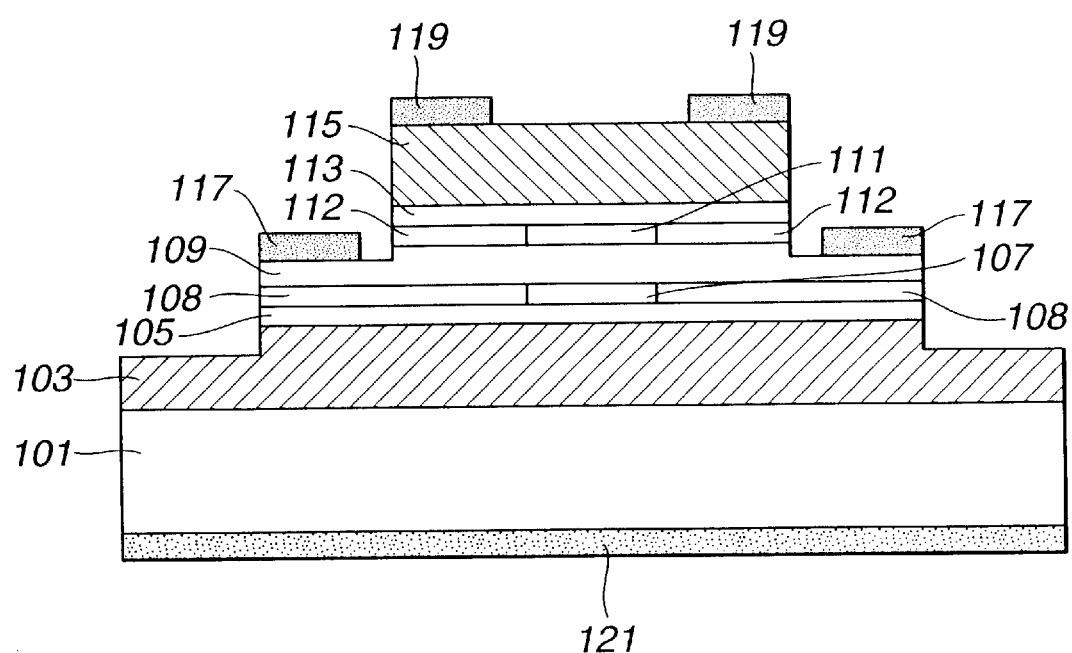
FIG. 3 is a cross-sectional view illustrating a first embodiment or example of the present invention.

Embodiments of a surface emitting laser apparatus of the present invention will be described by reference to FIGS. 3 and 4A to 4E.

A first embodiment uses an n-type GaAs substrate 101 and oscillates light at a wavelength of 830 nm. In the first embodiment, a first n-type semiconductor multi-layer mirror 103 of n-$Al_{0.9}Ga_{0.1}As$/n-$Al_{0.1}Ga_{0.9}As$, a first active layer 105, a first p-type current confinement layer 107 including a first Al-containing semiconductor layer, a p-type spacer layer 109, a second p-type current confinement layer 111 including a second Al-containing semiconductor layer, a second active layer 113, and a second n-type semiconductor multi-layer mirror 115 of n-$Al_{0.9}Ga_{0.1}As$/n-$Al_{0.1}Ga_{0.9}As$ are formed on the n-type GaAs substrate 101. A cavity structure is thus constructed.

The material is then removed until the side of the lower first p-type current confinement layer 107 is exposed to form a pole-shaped light-radiation region. The first and second Al-containing semiconductor layers 107 and 111 are oxidized from their sides, and the current confinement structure is built near the central portion of the light-radiation region. After that, the material of the peripheral portion of the light-radiation region is removed until the surface of the spacer layer 109 is exposed to form a step structure. A p-side electrode 117 is formed on the exposed surface of the spacer layer 109. Further, a first n-side electrode 121 is formed on the bottom surface of the substrate 101, and a second n-side electrode 119 is formed on and is electrically connected to the second n-type semiconductor multi-layer mirror 115.

Each of the first and second active layers 105 and 113 consists of a triple quantum well structure of GaAs/$Al_{0.3}Ga_{0.7}As$ with a photo luminescence (PL) peak wavelength of 830 nm, which is sandwiched between AlGaAs carrier block layers, for example. The total thickness of the active layer is set to one wavelength such that the structure of FIG. 5, to be described later, can be readily achieved. The carrier block layer can be either a layer of $Al_{0.5}Ga_{0.5}As$, or a composition-modulated layer whose Al mole fraction is gradually changed in the layering direction, for example.

Each of the first and second n-type semiconductor multi-layer mirrors 103 and 115 can have a structure of n-$Al_{0.9}Ga_{0.1}As$/n-$Al_{0.1}Ga_{0.9}As$, or a structure of low refractive-index layers (layers having a larger Al mole fraction), high refractive-index layers (layers having a smaller Al mole fraction) and composition-modulated layers interposed between the low and high refractive-index layers. In the latter structure, the band-gap energy is continuously changed to further reduce the resistance of the device.

Each of the first and second p-type current confinement layers 107 and 111 includes a three-layer structure having an Al-containing layer of p-AlAs (a selective oxidization layer) sandwiched between layers of p-$Al_{0.9}Ga_{0.1}As$, for example. Here, the following phenomenon is employed. When AlGaAs is thermally oxidized, the oxidization rate becomes faster as the Al mole fraction increases. Almost no oxidization occurs when the Al mole fraction is below about 0.9. Therefore, when the above current confinement layer 107 or 111 is oxidized while the light-radiation region remains untouched, only the AlAs layer is changed to an insulating layer 108 or 112 of $Al_xO_y$, whereas the upper and lower p-$Al_{0.9}Ga_{0.1}As$ are left unchanged. The current confinement structure is thus established above and below the p-type spacer layer 109.

In the above three-layer structure, the oxidization rate is slower at the interface between the p-AlAs layer and the p-$Al_{0.9}Ga_{0.1}As$ layer than at a central portion (with respect to the layering direction) of the p-AlAs layer. Accordingly, the profile of the thus-formed $Al_xO_y$ layer tapers towards its central portion (with respect to the layering direction). As a result, the refractive index averaged along a direction perpendicular to the layering direction continuously changes, so that the adverse effect of loss due to light scattering and the like can be reduced. Further, to reduce the adverse effect of scattering at the interfaces of the $Al_xO_y$ layer as much as possible, it is desirable to set thicknesses of the layers in the current confinement structure such that the AlAs layer is located at the node of the electric-field standing wave present in the cavity.

Each of the first and second p-type current confinement layer 107 and 111 may be comprised of a single layer of AlAs, or an AlGaAs layer having the Al mole fraction of over 0.9.

The p-type spacer layer 109 is comprised of a single layer of p-Al$_{0.1}$Ga$_{0.9}$As, for example. To decrease the threshold current of the device, it is desirable to set the thickness of the spacer layer 109 such that each of the active layers 105 and 113 is located at the loop of the electric-field standing wave.

To reduce the resistance of the device, it is desirable that the resistance of the p-type spacer layer 109 is lowered by increasing its doping concentration. When this is done, however, the threshold current increases since the light absorptivity increases in the spacer layer 109. Therefore, the following structure can preferably be adopted. The spacer layer 109 is comprised of alternately layering semiconductor layers with high and low doping concentrations, and materials, compositions and thicknesses of the respective semiconductor layers are set such that the semiconductor layers with high doping concentrations are located at nodes of the electric-field standing wave.

The n-side electrodes 119 and 121 can be formed of Ti/Au or AuGe/Ni/Au, and the p-side electrode 117 can be formed of Ti/Au or Cr/Au.

The substrate 101 can also be a semi-insulating GaAs substrate. In this case, a contact layer having a high doping concentration is formed as an n-Al$_{0.1}$Ga$_{0.9}$As in the first n-type semiconductor multi-layer mirror 103, and a portion of the contact layer is exposed in a region outside the light-radiation region. The first n-side electrode is formed on the exposed portion of the contact layer. Here, where a plurality of light-emitting devices are arranged in the surface emitting laser apparatus, it is easy to establish a structure in which the first n-side electrodes of the respective devices are electrically insulated from each other. Thus, electric interference between the devices can be reduced, and current injection or voltage application can be independently performed for the first and second n-side electrodes of the respective devices. Accordingly, a surface emitting laser array for wavelength division multiplexing can be readily constructed on a commonly-layered structure.

The above structure can be driven in the following manners. (1) The first and second n-side electrodes are electrically connected and put on an equipotential level, and current is injected or voltage is applied between these n-side electrodes and the p-side electrode to drive the laser apparatus. (2) Current injection or voltage application between the first n-side electrode and the p-side electrode is performed independently from that between the second n-side electrode and the p-side electrode to drive the laser apparatus. (3) Modulated current injection or modulated voltage application is performed between the second n-side electrode and the p-side electrode while bias current injection or bias voltage application is performed between the first n-side electrode and the p-side electrode (or vice versa). The laser apparatus is thus driven. Here, modulation amplitude of the modulated current or modulated voltage can be decreased, and the modulation speed can be increased.

Where a plurality of light-emitting devices are arranged, the apparatus can be driven as follows. (1) The first n-side electrodes of the devices are electrically connected and put on an equipotential level, and the p-side electrodes of the devices are electrically connected and put on an equipotential level. A common bias current or common bias voltage is injected or applied between the first n-side electrodes and the p-side electrodes of the devices. Modulated currents or modulated voltages are independently injected or applied between the second n-side electrodes and the p-side electrodes in the respective light-emitting devices. Thus, oscillation conditions of the devices are modulated, respectively.

(2) The p-side electrodes of the devices are electrically connected and put on an equipotential level, and a ratio between a current injected between the first n-side electrode and the p-side electrodes and a current injected between the second n-side electrode and the p-side electrodes, or a ratio between a voltage applied between the first n-side electrode and the p-side electrodes and a voltage applied between the second n-side electrode and the p-side electrodes is changed in each device. Thus, the respective lasers can be independently driven, and a surface emitting laser array for wavelength division multiplexing can be readily constructed.

In the surface emitting laser apparatus of the present invention, a high-speed modulation can advantageously be achieved since the apparatus can be driven using a driver of a common-anode type.

In the above embodiments, the oscillation wavelength is not limited to 830 nm, and material, composition, thickness and layer number of the layers can be naturally appropriately selected based on a desired oscillation wavelength.

The substrate can also be an InP substrate or an AlGaAs substrate, instead of the GaAs substrate discussed above.

The Al-containing semiconductor layer to be selectively oxidized can be composed of at least one of Al$_x$Ga$_{1-x}$As, Al$_x$In$_{1-x}$As, Al$_x$Ga$_{1-x}$P, Al$_x$In$_{1-x}$P, (Al$_x$Ga$_{1-x}$)$_y$In$_{1-y}$As, and (Al$_x$Ga$_{1-x}$)$_y$In$_{1-y}$P ($0 \leq x \leq 1$, $0 \leq y \leq 1$), instead of the AlAs discussed above.

Further, in the above embodiments, the first and second active layers are formed of the same composition. However, these layers can be differently formed so as to more flexibly control the oscillation. Likewise, the first and second p-type current confinement layers can be differently constructed. Thus, the wavelength shift can be effectively increased when the ratio between the current injected between the first n-side electrode and the p-side electrode and the current injected between the second n-side electrode and the p-side electrode, or the ratio between the voltage applied between the first n-side electrode and the p-side electrode and the voltage applied between the second n-side electrode and the p-side electrode is changed.

Furthermore, the current confinement effect can be enhanced by forming an n-type current confinement layer also between the active layer and the n-type semiconductor multi-layer mirror.

More specific examples will be described by reference to the drawings.

Figure 4A:
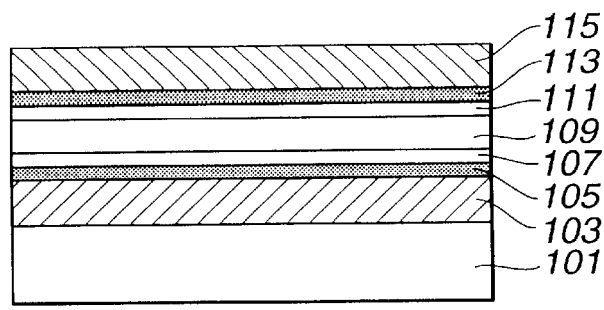
FIGS. 4A to 4E are cross-sectional views illustrating steps of fabricating the first embodiment or example of the present invention.

A first example of the surface emitting laser apparatus will be described with reference to FIGS. 3 and 4A to 4E. The first example is fabricated in the following manner. Initially, as illustrated in FIG. 4A, the first n-type semiconductor multi-layer mirror 103 comprised of 22.5 pairs of n-Al$_{0.9}$Ga$_{0.1}$As/n-Al$_{0.1}$Ga$_{0.9}$As, the first active layer 105, the first p-type current confinement layer 107, the p-type spacer layer 109, the second p-type current confinement layer 111, the second active layer 113, and the second n-type semiconductor multi-layer mirror 115 comprised of 22 pairs of n-Al$_{0.9}$Ga$_{0.1}$As/n-Al$_{0.1}$Ga$_{0.9}$As are formed on the n-type GaAs substrate 101. The cavity structure is thus constructed.

Figure 4B:
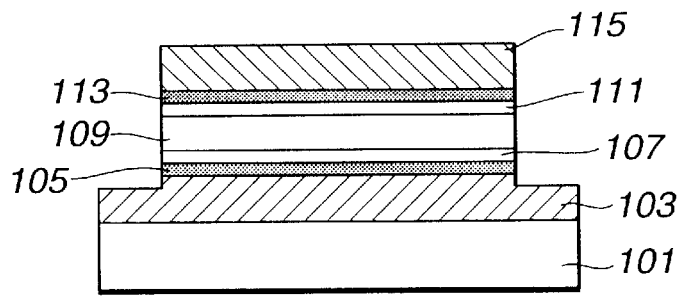

The semiconductor layers are then dry-etched by reactive ion etching using a chlorine (Cl) gas, as illustrated in FIG. 4B, until the side of the lower first p-type current confinement layer 107 is exposed with the pole-shaped radiation region being left untouched. Thus, the pole-shaped light-radiation region is formed with a diameter of 40 μm.

Figure 4C:
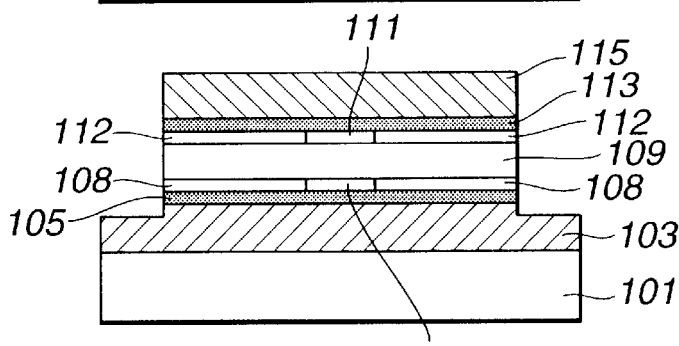

The first and second current confinement layers 107 and 111 are simultaneously oxidized from their sides to form insulating layers 108 and 112 of $Al_xO_y$, as illustrated in FIG. 4C. The insulating layers 108 and 112 are formed such that the current confinement region having a diameter of 5 µm is formed in a central portion of the pole-shaped light-radiation region. Oxidization is conducted for thirty five (35) minutes in a water vapor atmosphere at 390° C.

Figure 4D:
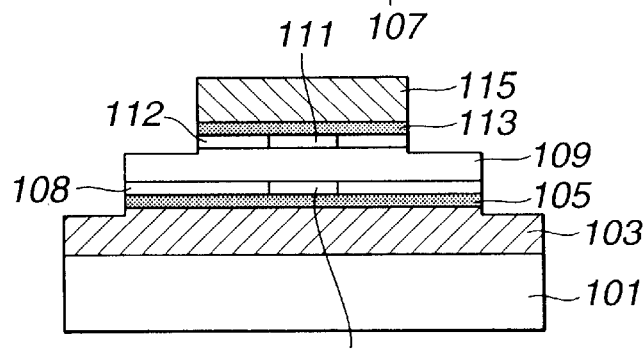

After that, material of the peripheral portion of the light-radiation region is etched until the surface of the p-type spacer layer 109 is exposed to form the step structure, as illustrated in FIG. 4D. An upper pole having a diameter of 20 µm is thus formed. The etching is performed in such a manner that the semiconductor layers are dry-etched while the $Al_xO_y$ layer 112 formed by the oxidization process is wet-etched by a mixture liquid of hydrofluoric acid and ammonium fluoride.

Figure 4E:
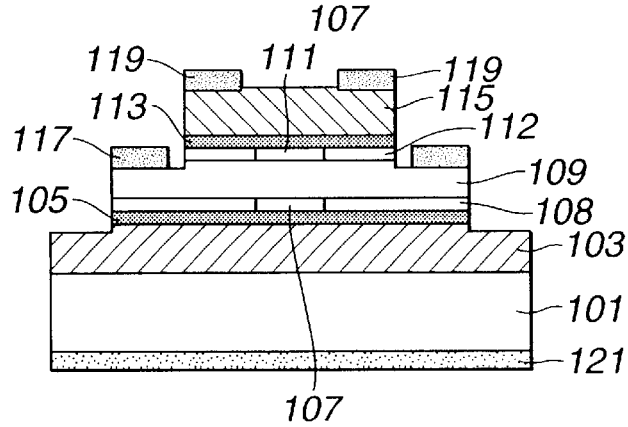

Finally, the p-type electrode 117 of Cr/Au is formed on a desired location of the exposed surface of the p-type spacer layer 109, and first and second n-type electrodes 121 and 119 of AuGe/Ni/Au are formed on the bottom surface of the substrate 101 and the second n-type semiconductor multi-layer mirror 115, respectively, as illustrated in FIG. 4E. An opening of a 10 µm diameter is formed in the second n-type electrode 119 to pass emitted light therethrough.

In the above fabrication method of the first example, the first and second p-type current confinement layers 107 and 111 prior to the oxidization process can have the same profile and can be simultaneously oxidized under the same condition. Therefore, centers of the upper and lower current confinement structures can be approximately aligned, and the positional deviation of the two current confinement portions in the resonance direction can be suppressed. Consequently, the cavity loss can be reduced.

Figure 5:
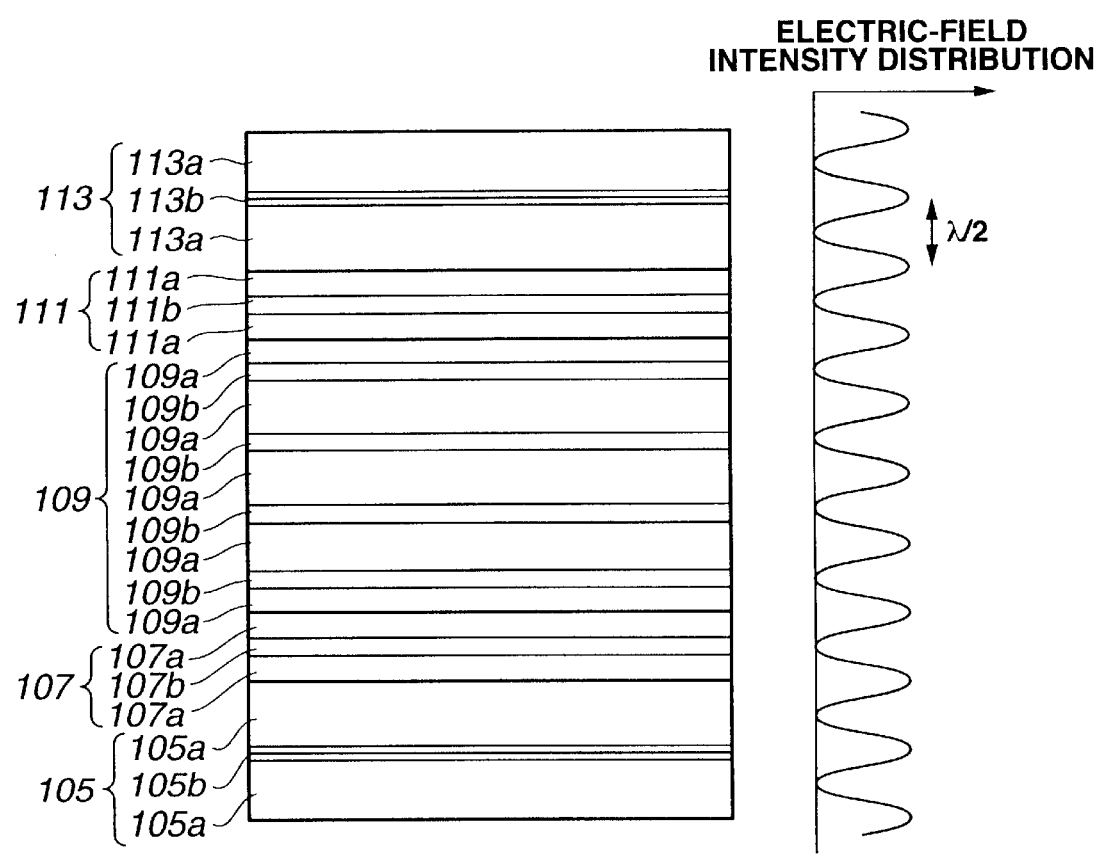
FIG. 5 is a view illustrating a detailed layer-structure of the first embodiment or example of the present invention.

Detailed constructions of the first and second active layers 105 and 113, the first and second p-type current confinement layers 107 and 111, and the p-type spacer layer 109 will be described by reference to FIG. 5.

Each of the first and second active layers 105 and 113 consists of a triple quantum well structure 105b or 113b of GaAs/$Al_{0.3}Ga_{0.7}As$ with a gain peak wavelength of 830 nm, which is sandwiched between AlGaAs carrier block layers 105a or 113a. The Al mole fraction of the carrier block layer 105a or 113a is gradually varied from 0.3 to 0.6. The thicknesses of the layers in the active layer 105 or 113 are regulated such that the optical thickness of the entire active layer is equal to one wavelength.

Each of the first and second p-type current confinement layers 107 and 111 is comprised of a three-layer structure having a p-AlAs layer 107b or 111b with a high oxidization rate sandwiched between p-$Al_{0.9}Ga_{0.1}As$ layers 107a or 111a with an almost zero oxidization rate. The thicknesses of the layers in the current confinement layer 107 or 111 are set such that the optical thickness of the entire current confinement layer is equal to one-half a wavelength, and the p-AlAs layer 107b or 111b is located at the node of the electric-field standing wave present in the cavity.

The p-type spacer layer 109 has a structure in which a p-$Al_{0.1}Ga_{0.9}As$ layer 109b with a high doping concentration of over $10^{19}$ cm$^{-3}$ sandwiched between p-$Al_{0.1}Ga_{0.9}As$ layers 109a with a low doping concentration of about $10^{18}$ cm$^{-3}$. The thicknesses of the layers in the spacer layer 109 are set such that the optical thickness of the entire spacer layer is equal to two wavelengths, and the layer 109b with a high doping concentration is located at the node of the electric-field standing wave present in the cavity to reduce absorption of light.

In the above structure, layers likely to cause losses due to light scattering and absorption are located at nodes of the electric-field standing wave, and gain-serving active layers are located at loops of the electric-field standing wave. Accordingly, the laser apparatus can be driven with a low threshold current.

The above first example can be driven in the following manners.

When the first and second n-side electrodes 121 and 119 are electrically connected and current is injected through the p-side electrode 117, a lasing threshold current can be 2.6 mA and a light output of 2.1 mW can be obtained under the current injection of 8 mA. The oscillation wavelength is 832 nm, the voltage is 2.45 V, and the differential resistance is 62Ω.

When the first and second n-side electrodes 121 and 119 are not electrically connected and a voltage of 2.45 V is applied between the first n-side electrode 121 and the p-side electrode 117, the differential resistance is 110Ω. Under the same condition, when a voltage of 2.45 V is applied between the second n-side electrode 119 and the p-side electrode 117, the differential resistance is 140Ω. It can be known therefrom that the device resistance can be decreased when the current confinement portions with a high resistance are connected in a parallel form.

When a square-shaped modulated current having an amplitude of 2 mA is injected between the second n-side electrode 119 and the p-side electrode 117 while a bias current of 2.5 mA is being injected between the first n-side electrode 121 and the p-side electrode 117, an intensity-modulated optical signal can be generated. Rise and decay times here are both below 1 ns.

When a current of 4 mA is injected between the first n-side electrode 121 and the p-side electrode 117 while a current of 4 mA is injected between the second n-side electrode 119 and the p-side electrode 117, oscillation light at 832.1 nm can be obtained. When those currents are changed to 3 mA and 5 mA, respectively, the wavelength of oscillated light is changed to 832.6 nm. Thus, it can be confirmed that the surface emitting laser apparatus of the first example can act as a wavelength tunable surface emitting laser.

Figure 6:
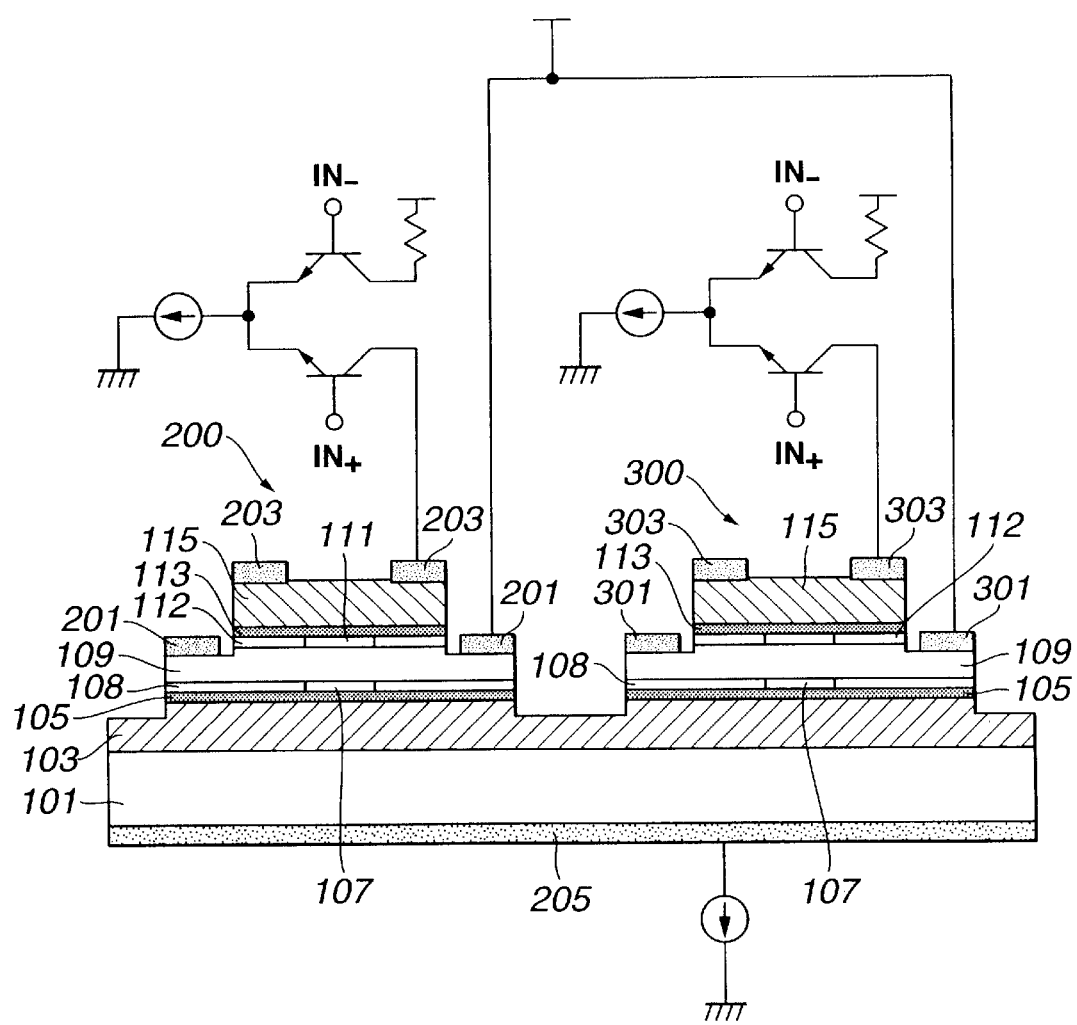
FIG. 6 is a cross-sectional view illustrating a second embodiment or example of the present invention.

A second example of the surface emitting laser apparatus will be described with reference to FIG. 6. The second example is directed to a surface emitting laser apparatus having a plurality of light-emitting devices, and its driving method. The layer structure of the second example is the same as that of the first example, and can be fabricated by the same method.

A structure with two surface emitting lasers is described in the following. As illustrated in FIG. 6, there are arranged surface emitting lasers 200 and 300 with the same construction as that of the first example. P-side electrodes 201 and 301 of Cr/Au are formed on respective desired locations of the p-type spacer layer 109.

Further, a first n-type electrode 205 of AuGe/Ni/Au is formed on the bottom surface of the substrate 101, and second n-type electrodes 203 and 303 of AuGe/Ni/Au are formed on the second n-type semiconductor multi-layer mirrors 115 of the devices 200 and 300, respectively. An opening is formed in each of the electrodes 203 and 303 to pass emitted light therethrough.

The first n-type electrode 205 serves as a common electrode for the two surface emitting lasers 200 and 300. The p-side electrodes 201 and 301 are electrically connected and put on an equipotential level.

The common first n-type electrode 205 is connected to a current source for the bias current. The second n-side electrodes 203 and 303 of the two devices 200 and 300 are electrically connected to laser drivers of a common-anode type and current sources for the modulated current, respectively.

The second example can be driven as follows. When a bias current of 5 mA is injected, a bias current of 2.5 mA is injected into each surface emitting device. A modulated current injected into each device is set to 2 mA. Under this condition, when a modulation signal is applied to each laser driver, an intensity-modulated optical signal can be generated from each surface emitting device 200 and 300. The rise time and decay time here are both below 1 ns.

Thus, it can be confirmed that the surface emitting laser apparatus of the second example can be driven by the laser driver of a common-anode type.

Figure 7:
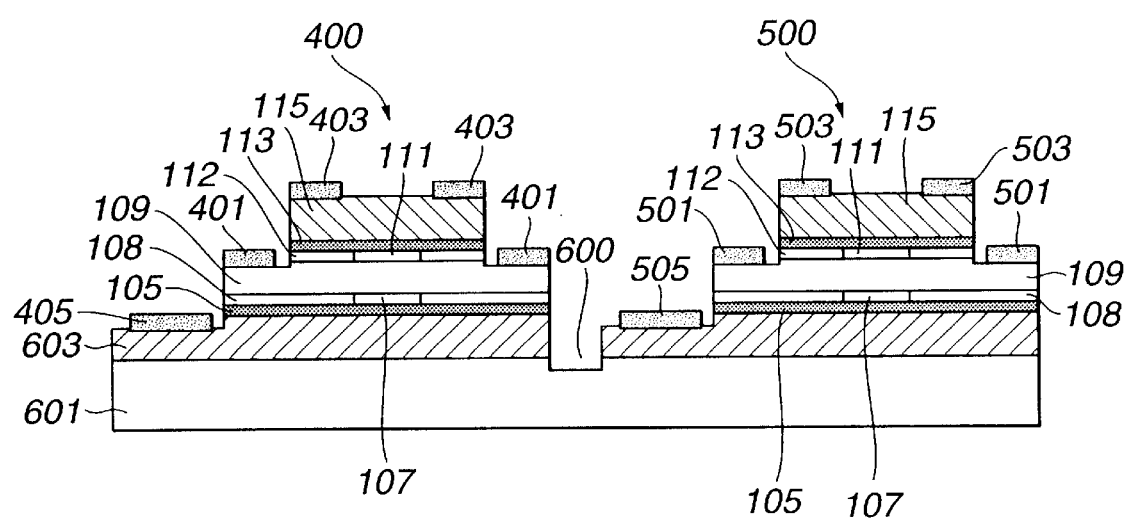
FIG. 7 is a cross-sectional view illustrating a third embodiment or example of the present invention.

A third example of the surface emitting laser apparatus will be described with reference to FIG. 7. The third example includes a plurality of surface emitting lasers 400 and 500. The third example uses a semi-insulating GaAs substrate 601, differently from the first example. In FIG. 7, the same portions as those of the first example are indicated by the same reference numerals used in the first example.

The third example is fabricated in the following manner. Initially, a first n-type semiconductor multi-layer mirror 603 comprised of 22.5 pairs of n-$Al_{0.9}Ga_{0.1}As$/n-$Al_{0.1}Ga_{0.9}As$, the first active layer 105, the first p-type current confinement layer 107, the p-type spacer layer 109, the second p-type current confinement layer 111, the second active layer 113, and the second n-type semiconductor multi-layer mirror 115 comprised of 22 pairs of n-$Al_{0.9}Ga_{0.1}As$/n-$Al_{0.1}Ga_{0.9}As$ are formed on the semi-insulating GaAs substrate 601. The cavity structure is thus constructed. A highly-doped contact layer (not shown in FIG. 7) of n-$Al_{0.1}Ga_{0.9}As$ is formed in the first n-type semiconductor multi-layer mirror 603.

The above cavity structure is etched such that a step structure is formed as illustrated in FIG. 7. Further, p-side electrodes 401 and 501 of Cr/Au are formed on desired locations of the p-type spacer layer 109, and first n-type electrodes 405 and 505 of AuGe/Ni/Au and second n-type electrodes 403 and 503 of AuGe/Ni/Au are formed on the contact layer in the first n-type semiconductor multi-layer mirror 603 and the second n-type semiconductor multi-layer mirror 115, respectively. Surface emitting lasers 400 and 500 are thus fabricated. An opening is formed in each of the electrodes 403 and 503 to pass the emitted light therethrough. A separation groove 600 is formed down into the semi-insulating substrate 601 between the surface emitting lasers 400 and 500 such that the devices can be electrically separated.

The third example can be driven in the following manners.

When a current of 4 mA is injected between the first n-side electrode 405 and the p-side electrode 401 of the laser 400 and a current of 4 mA between the second n-side electrode 403 and the p-side electrode 401 of the laser 400, oscillation light at 831.9 nm can be generated from the device 400. On the other hand, when a current of 3 mA is injected between the first n-side electrode 505 and the p-side electrode 501 of the laser 500 and a current of 5 mA between the second n-side electrode 503 and the p-side electrode 501 of the laser 500, oscillation light at 832.4 nm that is 0.5 nm different from 831.9 nm can be generated from the device 500. No considerable difference in the output power exists therebetween. Thus, it can be confirmed that the surface emitting laser apparatus of the third example with the lasers 400 and 500 of a commonly-layered structure can act as a multi-wavelength surface emitting laser array.

The third example can also be driven in a manner using the bias current and the modulated current, as discussed in the second example. That is, although the device resistance and threshold current may vary among the devices due to the fabrication process and the like, light output and amplitude at the time of modulating these devices can be made constant by regulating the bias current for each device. Thus, the modulation operation can be achieved with a better controllability in the third example than the second example. Further, since the devices are electrically separated, modulated signals of the respective devices do not interfere with each other, resulting in a more stable operation of each device.

As described in the foregoing, according to the present invention, the operation voltage and consumption power can be reduced due to a low resistance of the laser apparatus, a structure of the common-anode type can be constructed, a high-speed modulation is possible, and the surface emitting laser apparatus capable of changing its oscillation wavelength and performing the wavelength division multiplexing, its fabrication method and its driving method can be achieved.

While the present invention has been described with respect to what is presently considered to be the preferred embodiments, it is to be understood that the invention is not limited to the disclosed embodiments. The present invention is intended to cover various modifications and equivalent arrangements included within the spirit and the scope of the appended claims.

What is claimed is:

1. A surface emitting laser apparatus having at least a light-emitting device, said apparatus comprising:
    a substrate;
    a cavity structure of said light-emitting device, said cavity structure including:
        a first n-type semiconductor multi-layer mirror formed on said substrate;
        a first active layer formed on said first n-type semiconductor multilayer mirror;
        a p-type spacer layer formed on said first active layer;
        a second active layer formed on said p-type spacer layer;
        a second n-type semiconductor multi-layer mirror formed on said second active layer;
        a first current confinement structure formed in a vicinity of said first active layer;
        a second current confinement structure formed in a vicinity of said second active layer;
        a p-side electrode electrically connected to said p-type spacer layer;
        a first n-side electrode electrically connected to said first n-type semiconductor multi-layer mirror; and
        a second n-side electrode electrically connected to said second n-type semiconductor multi-layer mirror.

2. The surface emitting laser apparatus of claim 1, wherein said first current confinement structure comprises a first p-type current confinement layer formed between said first active layer and said p-type spacer layer and includs a first Al-containing semiconductor layer which is selectively oxidized, and wherein said second current confinement structure comprises a second p-type current confinement layer formed between said second active layer and said p-type spacer layer and includs a second Al-containing semiconductor layer which is selectively oxidized.

3. The surface emitting laser apparatus of claim 1, wherein said substrate comprises an n-type semiconductor substrate, and said first n-type semiconductor multi-layer mirror is electrically connected to said first n-side electrode through said substrate.

4. The surface emitting laser apparatus of claim 1, wherein said substrate comprises a semi-insulating-type semiconductor substrate, said first n-type semiconductor multi-layer mirror includes a contact layer a portion of which is exposed, said first n-side electrode is formed on said exposed portion, and said first n-type semiconductor multi-layer mirror is electrically connected to said first n-side electrode through said contact layer.

5. The surface emitting laser apparatus of claim 1, wherein a number of layers, a material, a composition, and a thickness of said p-type spacer layer are determined such that said first and second active layers are positioned at loops of electric-field standing waves present in said cavity structure, respectively.

6. The surface emitting laser apparatus of claim 2, wherein a number of layers, a material, a composition, and a thickness of said first and second p-type current confinement layers are determined such that said first and second Al-containing semiconductor layers are positioned at nodes of electric-field standing waves present in said cavity structure, respectively.

7. The surface emitting laser apparatus of claim 1, wherein said p-type spacer layer comprises alternately-layered semiconductor layers of a high doping concentration and semiconductor layers of a low doping concentration, and wherein a number of layers, materials, compositions, and thicknesses of said semiconductor layers of high and low doping concentrations are determined such that said semiconductor layers of a high doping concentration are positioned at nodes of electric-field standing waves present in said cavity structure, respectively.

8. The surface emitting laser apparatus of claim 2, further comprising a third current confinement structure including a third Al-containing semiconductor layer and an n-type current confinement layer, said n-type current confinement layer being interposed between said first n-type semiconductor multi-layer mirror and said first active layer, and/or between said second n-type semiconductor multi-layer mirror and said second active layer.

9. The surface emitting laser apparatus of claim 1, wherein said apparatus includes a plurality of light-emitting devices, and wherein said apparatus is of a common-anode type in which said p-side electrodes of said light-emitting devices are electrically connected to each other.

10. The surface emitting laser apparatus of claim 2, wherein said first and second Al-containing semiconductor layers comprise at least one of $Al_xGa_{1-x}As$, $Al_xIn_{1-x}As$, $Al_xGa_{1-x}P$, $Al_xIn_{1-x}P$, $(Al_xGa_{1-x})_yIn_{1-y}As$, and $(Al_xGa_{1-x})_yIn_{1-y}P$ $(0 \leq x \leq 1, 0 \leq y \leq 1)$.

11. A surface emitting laser apparatus having at least a light-emitting device, said apparatus comprising:
 a substrate; and
 a cavity structure of said light-emitting device, said cavity structure including;
  a first n-type semiconductor multi-layer mirror formed on said substrate;
  an active layer formed on said first n-type semiconductor multi-layer mirror;
  a p-type spacer layer formed over said active layer;
  a second n-type semiconductor multi-layer mirror formed over said active layer;
  a current confinement structure formed in the vicinity of said active layer;
  a p-side electrode electrically connected to said p-type spacer layer;
  a first n-type electrode electrically connected to said first n-type semiconductor multi-layer mirror; and
  a second n-side electrode electrically connected to said second n-type semiconductor multi-layer mirror.

* * * * *

UNITED STATES PATENT AND TRADEMARK OFFICE
CERTIFICATE OF CORRECTION

PATENT NO. : 6,804,279 B2
DATED : October 12, 2004
INVENTOR(S) : Yukio Furuka

It is certified that error appears in the above-identified patent and that said Letters Patent is hereby corrected as shown below:

Column 1,
Line 62, "ann-type" should read -- an n-type --.

Column 4,
Line 65, "plurality" should read -- plurality of --.

Column 5,
Line 12, "plurality" should read -- plurality of --.

Column 12,
Line 39, "multilayer" should read -- multi-layer --;
Line 58, "includs" should read -- includes --; and
Line 63, "includs" should read -- includes --.

Signed and Sealed this

Fifteenth Day of February, 2005

JON W. DUDAS
*Director of the United States Patent and Trademark Office*